(12) United States Patent
Cholasta

(10) Patent No.: US 9,823,798 B2
(45) Date of Patent: Nov. 21, 2017

(54) CAPACITIVE SENSOR DEVICE AND METHOD OF OPERATION

(71) Applicant: FREESCALE SEMICONDUCTOR, INC., Austin, TX (US)

(72) Inventor: Petr Cholasta, Hutisko-Solanec (CZ)

(73) Assignee: NXP USA, Inc., Austin, TX (US)

( * ) Notice: Subject to any disclaimer, the term of this patent is extended or adjusted under 35 U.S.C. 154(b) by 50 days.

(21) Appl. No.: 15/094,333

(22) Filed: Apr. 8, 2016

(65) Prior Publication Data

US 2017/0293375 A1    Oct. 12, 2017

(51) Int. Cl.
*G06F 3/044*    (2006.01)
*G06F 3/041*    (2006.01)

(52) U.S. Cl.
CPC ............ *G06F 3/044* (2013.01); *G06F 3/0416* (2013.01)

(58) Field of Classification Search
CPC ................................ G06F 3/044; G06F 3/0416
See application file for complete search history.

(56) References Cited

U.S. PATENT DOCUMENTS

| | | | |
|---|---|---|---|
| 2009/0224776 A1* | 9/2009 | Keith .................. | H03K 17/962 324/686 |
| 2010/0181180 A1 | 7/2010 | Peter | |
| 2011/0073383 A1* | 3/2011 | Simmons ............. | H03K 17/962 178/18.06 |
| 2013/0088377 A1* | 4/2013 | Lundstrum ......... | H03M 1/1245 341/172 |

OTHER PUBLICATIONS

"mTouchTM Sensing Solution Acquisition Methods Capacitive Voltage Divider", http://ww1.microchip.com/downloads/en/AppNotes/01478A.pdf, Microchip Technology Inc., 2012, 28 pages.
Atmel QTouch Library, User Guide, http://www.atmel.com/images/doc8207.pdf, Atmel Corporation, 2012, Chapter 5.2.1 (pp. 13-14).

* cited by examiner

*Primary Examiner* — Liliana Cerullo

(57) ABSTRACT

A capacitive sensor system includes a capacitive sensor device having a sense electrode that includes a first capacitor, a first supply voltage in, a first switch operable to couple the sense electrode to the first supply voltage during a first mode and an analog to digital converter during a second mode, a second switch operable to couple a second capacitor to a second supply voltage during the first mode and to an open circuit during the second mode, and a resistive element that includes a first terminal coupled between the first capacitor and the first switch, and a second terminal coupled between the second capacitor and the second switch.

20 Claims, 4 Drawing Sheets

CAPACITIVE SENSOR DEVICE AND METHOD OF OPERATION

BACKGROUND

Field

This disclosure relates generally to capacitive sensor devices, and more specifically, to capacitive sensor devices using a capacitor.

Related Art

Capacitive sensor devices are useful in a variety of different applications. For example, they may be used for touch screens which detect proximity or touch. In one capacitive touch sensor device, a capacitor internal to an analog-to-digital converter (ADC) is used as the sampling capacitor. However, the capacitor internal to the ADC is subject to process variations and cannot be precisely selected. This may therefore introduce inaccuracies into the capacitive sensor device. Therefore, a need exists for an improved capacitive sensor device that is less subject to process variations and reduces inaccuracies.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A capacitive sensor device can be used to detect changes in capacitance in a variety of applications. These applications which utilize a capacitive sensor device may be referred to as capacitive sensor systems. In the capacitive sensor device, an initial charge distribution is performed by charge redistribution between an external fixed capacitor and an external sensing capacitor. Once the voltage equalizes between the two, the sensor voltage on the external sensing capacitor or the external fixed capacitor is converted from the analog to digital domain by an ADC. When the capacitance of the external sensing capacitor changes, the sensor voltage changes. In one example, the external sensing capacitor corresponds to an electrode of a capacitive sensor system, such as an electrode of a touch screen or a touch door handle. In this manner, when a touch or proximity event occurs on the electrode, it can be detected by the capacitive sensor device. By using an external fixed capacitor in addition to the external sensing capacitor, improved control and accuracy can be achieved of the external fixed capacitor and of the capacitor sensor device.

Figure 1:
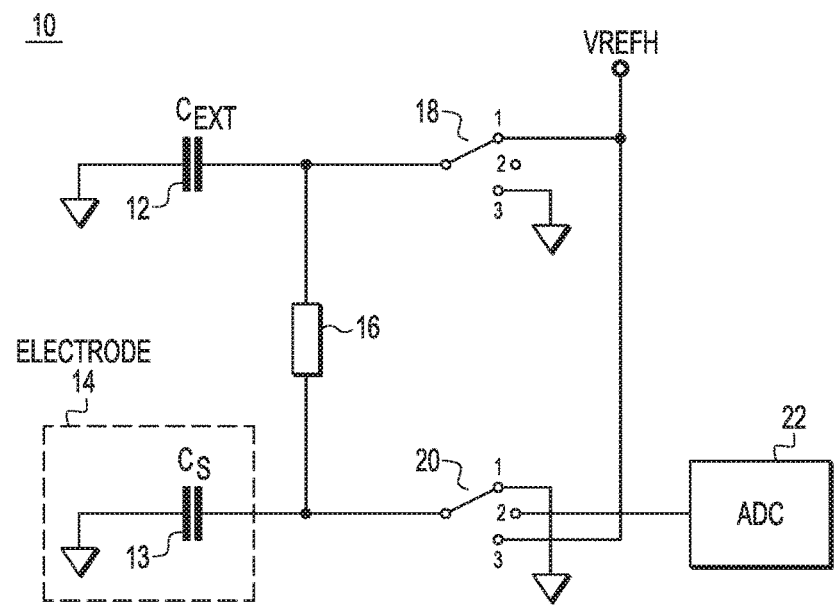
FIG. 1-3 illustrate in schematic form, a capacitive sensor device with various switch configurations in accordance with one embodiment of the present invention.

FIG. 1 illustrates in schematic form, a capacitive sensor device 10 having a first switch configuration in accordance with one embodiment of the present invention. Device 10 includes an external capacitor (Cext) 12, an electrode 14 (also referred to as a sense electrode) which includes a sensing capacitor (Cs) 13, a resistive element 16, a switch 18, a switch 20, and an ADC 22. Note that ADC 22 may be considered external to device 10 or, alternatively, may be considered a part of device 10. Device 10 includes a first supply voltage terminal which supplies a high reference supply voltage, VREFH, and a second supply voltage terminal which corresponds ground. A first electrode of Cext 12 is coupled to the second supply voltage terminal, and a second electrode of Cext 12 is coupled to a first terminal of resistive element 16 and to a first terminal of switch 18. A second terminal of switch 18 is coupled to the first supply voltage terminal, a third terminal of switch 18 is coupled to an open circuit, and a fourth terminal of switch 18 is coupled to the second supply voltage terminal. Depending on the control input to switch 18, one of three different positions can be achieved. A first position connects the first terminal of switch 18 to the second terminal of switch 18. A second position connects the first terminal of switch 18 to the third terminal of switch 18. A third position connects the first terminal of switch 18 to the fourth terminal of switch 18. A first electrode of Cs 13, in electrode 14, is coupled to the second supply voltage terminal. Electrode 14 (and a second electrode of Cs 13) is coupled to a second terminal of resistive element 16 and a first terminal of switch 20. In one embodiment, electrode 14 may have only one terminal (corresponding to the second electrode of Cs 13) in which the first electrode of Cs 13 is virtual terminal linked to the second supply voltage terminal. A second terminal of switch 20 is coupled to the second supply voltage terminal, a third terminal of switch 20 is coupled to a ADC 22, and a fourth terminal of switch 18 is coupled to the first supply voltage terminal. Depending on the control input to switch 20, one of three different positions can be achieved. A first position connects the first terminal of switch 20 to the second terminal of switch 20. A second position connects the first terminal of switch 20 to the third terminal of switch 20. A third position connects the first terminal of switch 20 to the fourth terminal of switch 20. Note that the numbers "1", "2", and "3" on FIGS. 1-7 for switches 18 and 20 refer to the first, second and third positions of the switch and not the switch terminal.

In operation, as illustrated in the switch configuration of FIG. 1, the control inputs for switches 18 and 20 are set so as to place each switch in its first position for a first mode. In this first mode, Cext 12 is coupled by switch 18 to VREFH, thus charging Cext 12. Cs 13 is coupled by switch 20 to ground, thus discharging Cs 13.

Figure 2:
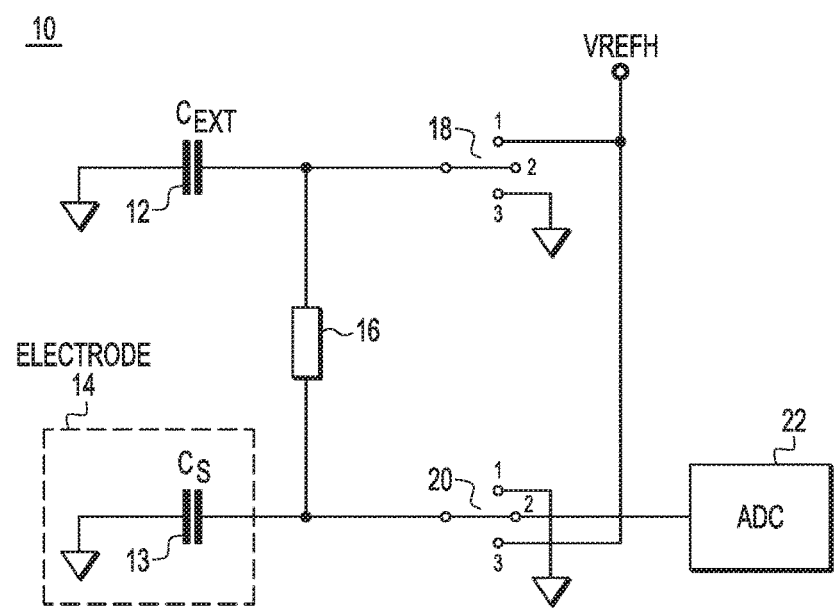

FIG. 2 illustrates a next switch configuration in which, once Cext 12 is charged and Cs 13 is discharged, switches 18 and 20 are simultaneously moved to their respective second position for a second mode. In this second mode, switch 18 connects the second terminal of Cext 12 to an open circuit and switch 20 connects electrode 14 to the high impedance input of ADC 22. With this configuration, the charge on Cext 12 is distributed between Cext 12 and Cs 13 via resistive element 16. In one embodiment, Cext 12 is selected so that it is equal in capacitance to Cs 13. In this manner, after the charge distribution, the voltage over each capacitor is equal. Also, in this second mode, conversion of the voltage on Cs 13 (the sense voltage at the second electrode of Cs 13) from an analog signal to a digital signal is performed by ADC 22 for further processing. The digital signal can be used, for example, to detect a touch or proximity even on electrode 14.

For example, when a touch event occurs, the capacitance on Cs 13 increases, which causes the sense voltage at the input of ADC 22 to decrease. When a release of the touch occurs, the capacitance on Cs 13 decreases, which causes the sense voltage at the input of ADC 22 to increase. Therefore, the digital output of ADC 22 can be used to detect a touch or release of touch event, or indicate a degree of proximity of a touch event.

Figure 3:
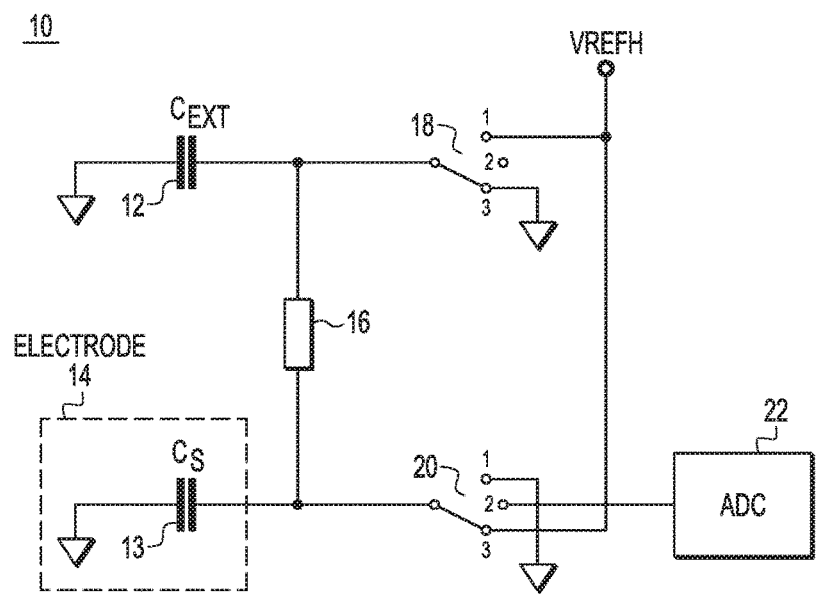

FIG. 3 illustrates a switch configuration which can be used for an alternate operation for the first mode. In an alternate embodiment, in the first mode, Cext 12 is discharged and Cs 13 is charged. For this first mode, the switches can be placed into their respective third position in which Cext 12 is connected by switch 18 the second supply voltage terminal and Cs 13 is connected by switch 20 to the first supply voltage terminal. Once Cext 12 is discharged and Cs 13 is charged, switches 18 and 20 can be placed in their respective second positions so as to enter the second mode, as described above. That is, in this second mode, the charge over Cs 13 is distributed between Cs 13 and Cext 12 via resistive element 16 which equalizes the voltages on Cs 13 and Cext 12, and the conversion by ADC 22 begins. In this embodiment, when a touch event occurs, sense voltage at the input of ADC 22 increases, and when a release of the touch occurs, the sense voltage decreases.

Figure 4:
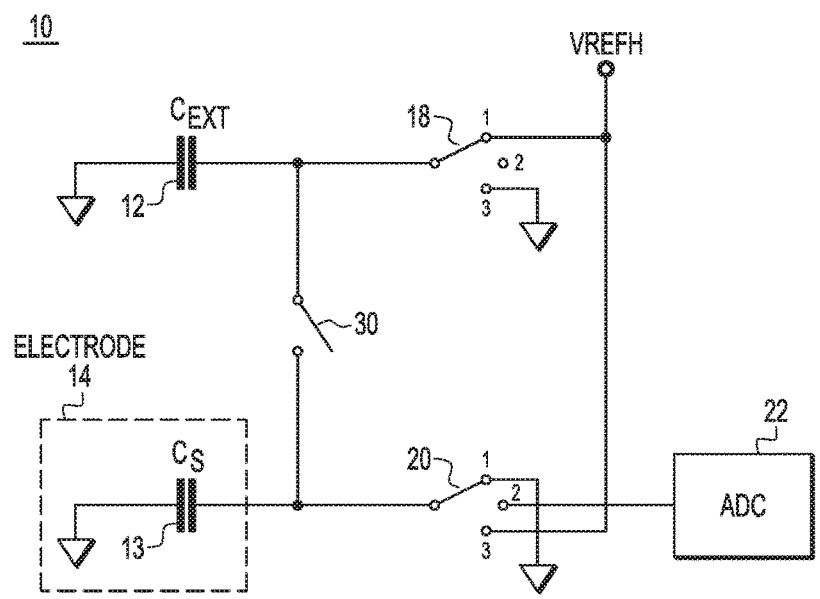
FIG. 4-6 illustrate in schematic form, a capacitive sensor device with various switch configurations in accordance with one embodiment of the present invention
Figure 5:
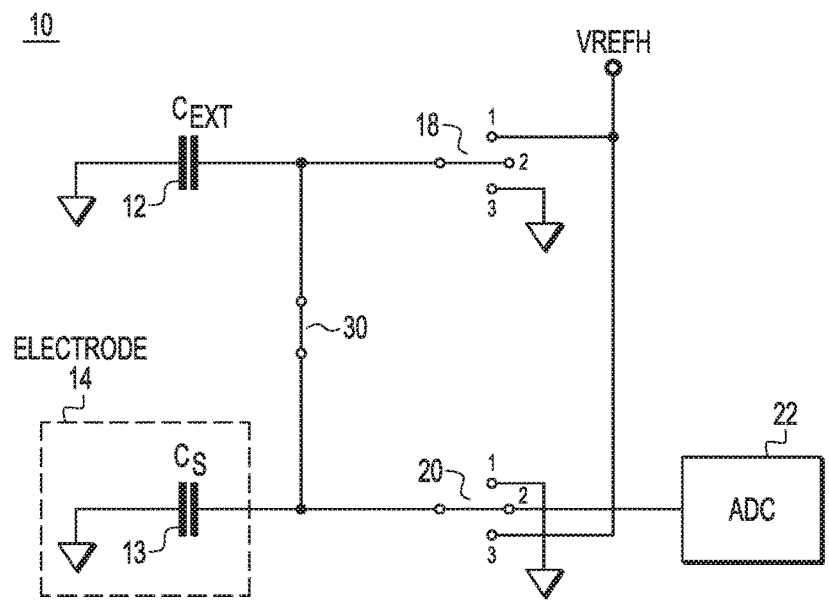
Figure 6:
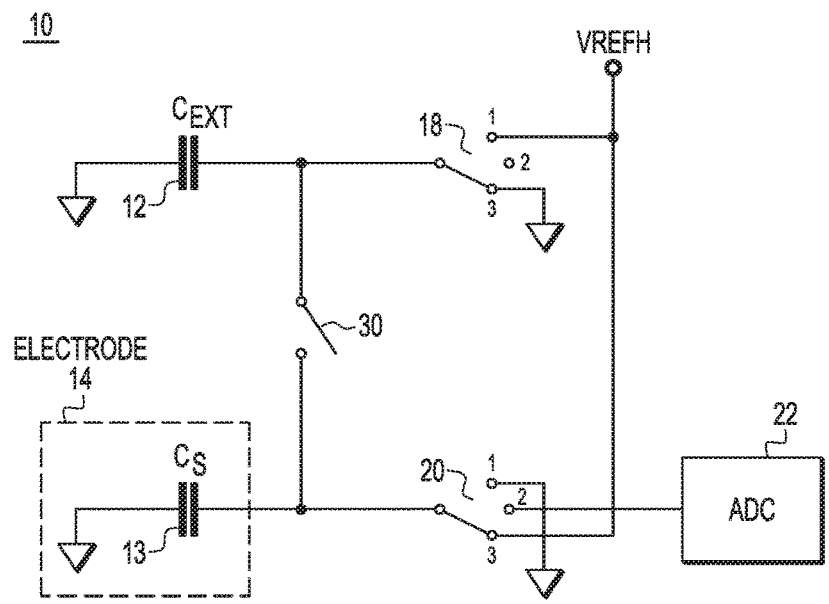

In the embodiments of FIGS. 1-3, resistive element 16 can be implemented as a fixed resistor. FIGS. 4-6 illustrate device 10 in accordance with an alternate embodiment in which resistive element 16 is implemented with a switch 30. Switch 30 includes a first terminal coupled to the second terminal of Cext 12 and a second terminal coupled to the second terminal of Cs 13. During the first mode, switch 30 is configured as illustrated in FIGS. 4 and 6, in which switch 30 is in an open position. In this manner, Cext 12 can be charged via switch 18 and Cs 13 can be discharged via switch 20 (as in FIG. 4) or Cext 12 can be discharged via switch 18 and Cs can be charged via switch 20 (as in FIG. 6). During the second mode, switch 30 is configured as illustrated in FIG. 5 in which switch 30 is closed after switches 18 and 20 are placed in their respective second positions. In this manner, with switch 30 closed, the charge is distributed between Cext 12 and Cs 13 via the resistive element of switch 30. As described above, when the voltages on Cext 12 and Cs 13 are equal, conversion by ADC 22 begins.

In one embodiment, the resistance of resistive element 16, whether implemented as a fixed resistor or as switch 30, is in a range of 1 to 10 kilo Ohms. In one embodiment, the capacitance of Cs 13 and thus Cext 12 is in a range of 5 to 20 picofarads. Also, in an alternate embodiment, switches 18 and 20 can be configured so that voltage at the second electrode of Cext 12 rather than Cs 13 can be used for the conversion by ADC 22. That is, ADC 22 can be coupled to a terminal of switch 18 rather than switch 20.

Figure 7:
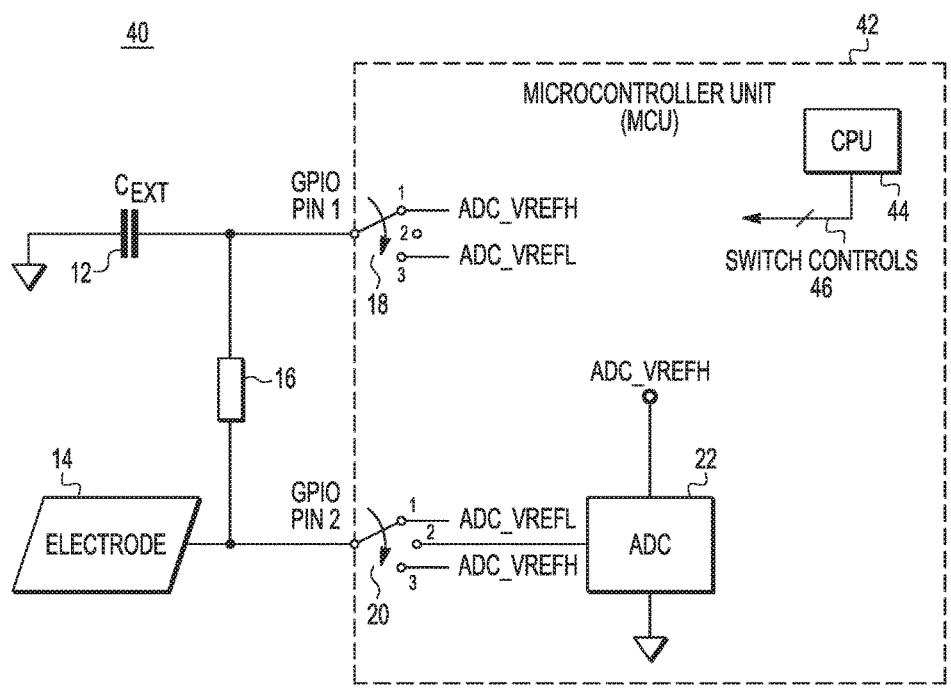
FIG. 7 illustrates, in partial schematic and partial block diagram form, a capacitive sensor system, in accordance with one embodiment of the present invention.

FIG. 7 illustrates, in partial schematic and partial block diagram form, a capacitive sensor system which include capacitive device 10. System 40 includes a microcontroller unit (MCU) 42 which includes switches 18 and 20 of device 10, and may also include switch 30 of device 10 in the embodiment in which resistive element 16 is implemented with switch 30. MCU 42 includes ADC 22 and a central processing unit (CPU) 44 which controls operation of MCU 42. For example, software is executed on CPU 44 to perform various operations. CPU 46 provides switch control signals 46 to control inputs of switches 18 and 20, and switch 30, if also included in MCU 42. Software executing on CPU 44 can therefore control the values of switch control signals 46 to configure the switches for the different modes of operation, described above. Therefore, CPU 44 may also be referred to as control circuitry. In an alternate embodiment, different control circuitry may be used, such as a state machine or other logic.

System 40 can be used in any application which needs a capacitive change sensor. For example, system 40 can be used for a proximity or touch sensor application which detects the presence of an incoming or placed object. Other applications include, for example, a keypad or switch panel application, car door handle proximity and touch detection, or detection of a mobile device placement for wireless chargers.

As illustrated in FIG. 7, MCU 42 includes general purpose input/output (GPIO) pins 1 and 2. The second electrode of Cext 12 and the first terminal of resistive element 16 are coupled to GPIO pin 1, and the second terminal of resistive element 16 and electrode 14 (e.g. the second electrode of Cs 13) is coupled to GPIO pin 2. The ADC_VREFH supply terminal which supplies ADC_VREFH may match the first voltage supply terminal which supplies VREFH described in reference to FIGS. 1-6. GPIO pin 1 operates either as a high impedance input or output and GPIO pin 2 operates either as a high impedance input for ADC 22 or output. The operation of switch 18 is realized by GPIO pin 1 and switch 20 by GPIO pin 2. Each GPIO pin can changed from an output pin to an input pin at the same time.

Referring to FIG. 7, when switches 18 and 20 are in their respective first positions for the first mode of operation as described above in reference to FIGS. 1 and 4, GPIO pin 1 is configured as an output pin which outputs a logic level high equivalent to ADC_VREFH, and GPIO pin 2 is configured as an output pin which outputs a logic level low equivalent to ADC_VREFL (which may, for example, be the same voltage supplied by the second power supply terminal discussed above, such as ground). When switches 18 and 20 are in their respective second positions for the second mode of operation as described above in reference to FIGS. 2 and 5, GPIO pin 1 is configured as a high impedance input and GPIO pin 2 is configured as an ADC high impedance input. When switches 18 and 20 are in their respective third positions for the first mode of operation in the alternate embodiment as described above in reference to FIGS. 3 and 6, GPIO pin 1 is configured as an output pin which outputs a logic level low equivalent to ADC_VREFL, and GPIO pin 2 is configured as an output pin which outputs a logic level high equivalent to ADC_VREFH.

In prior systems which use a capacitor internal to the ADC as the sensing capacitor, a buffer may be present between the electrode (such as Cs 13) and the ADC. The existence of this buffer prevents such a system to be used for capacitive touch sensing. However, with the use of a fixed external capacitor, such as Cext 12, charge redistribution is enabled between Cext 12 and Cs 13 to allow the implementation of a capacitive touch sensor.

By now it can be understood how an improved capacitive sensor device and thus improved capacitive sensor system can be achieved. By using an external capacitor for Cext 12 that is external to ADC 22, the problems introduced by process variation for a capacitor internal to ADC 22 or the existence of extra circuitry, such as a buffer, can be avoided. Also, by using an external capacitor for Cext 12, the capacitance value of Cext 12 can be accurately matched to the electrode capacitance (the capacitance of Cs 13). In this manner, a more accurate capacitive sensor device can be achieved.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, the external capacitor, Cext 12, can be implemented as multiple capacitors. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

One embodiment includes a capacitive sensor system, including an analog to digital converter (ADC); and a capacitive sensor device. The capacitive sensor device includes: a sense electrode including a first capacitor; a first supply voltage; a first switch operable to couple the sense electrode to the first supply voltage during a first mode and the ADC during a second mode; a second capacitor; a second supply voltage different than the first supply voltage; a second switch operable to couple the second capacitor to the second supply voltage during the first mode and to an open circuit during the second mode; and a resistive element including a first terminal coupled between the first capacitor and the first switch, and a second terminal coupled between the second capacitor and the second switch. In one aspect, the first supply voltage is less than the second supply voltage and the second supply voltage is greater than zero. In another aspect, the first supply voltage is greater than zero and the second supply voltage is less than the first supply voltage. In another aspect, capacitance of the first capacitor is approximately equal to capacitance of the second capacitor. In another aspect, resistance of the resistive element is between 1 and 10 kilo Ohms. In another aspect, capacitance of the first and second capacitors is between 5 and 20 picofarads. In another aspect, the capacitive sensor system further includes a microcontroller including input/output ports coupled to the first and second capacitors; control circuitry in the microcontroller configured to control the first and second switches in the first mode to allow the first capacitor to discharge while the second capacitor charges; and control the first and second switches in the second mode once the first capacitor is discharged and the second capacitor is charged. In another aspect, the capacitive sensor system further includes a microcontroller including input/output ports coupled to the first and second capacitors; control circuitry in the microcontroller configured to control the first and second switches in the first mode to allow the first capacitor to charge while the second capacitor discharges; and control the first and second switches in the second mode once the first capacitor is charged and the second capacitor is discharged. In another aspect, the capacitive sensor device is a capacitive touch sensor. In another aspect, the resistive element is one of a group consisting of a resistor and a switch. In another aspect, when the resistive element is the switch, the switch is open during the first mode and closed during the second mode. In another aspect, the capacitive sensor device further includes a microprocessor, wherein the first and second capacitors are external to the microprocessor and the first and second switches are internal to the microprocessor.

In another embodiment, a capacitive sensor system includes an analog to digital converter (ADC); a capacitive sensor device including: an electrode external to the ADC; a first switch including a first terminal coupled to a first terminal of the electrode, and switchable to a first supply voltage during a first mode and to the ADC during a second mode; a capacitor external to the ADC; a second switch including a first terminal coupled to a first terminal of the capacitor, and switchable to a second supply voltage during the first mode and to an open circuit condition during the second mode. In one aspect, the capacitive sensor system further includes a resistive element including a first terminal coupled between the electrode and the first switch, and a second terminal coupled between the capacitor and the second switch. In another aspect, the capacitive sensor system further includes a third switch including a first terminal coupled between the electrode and the first switch, and a second terminal coupled between the capacitor and the second switch, wherein the third switch is open during the first mode and closed during the second mode. In another aspect, the capacitive sensor system further includes a microcontroller including the ADC and a first communication port coupled to a second terminal of the first switch and a second communication port coupled to a second terminal of the second switch. In another aspect, the capacitive sensor system further includes control circuitry in the microcontroller configured to perform at least one of a group consisting of: control the first and second switches in the first mode to allow a first capacitor in the electrode to discharge while the second capacitor charges, and control the first and second switches in the second mode once the first capacitor is discharged and the second capacitor is charged; and control the first and second switches in the first mode to allow the first capacitor to charge while the second capacitor discharges, and control the first and second switches in the second mode once the first capacitor is charged and the second capacitor is discharged. In another aspect, the first supply voltage is less than the second supply voltage and the second supply voltage is greater than zero. In another aspect, the first supply voltage is greater than zero and the second supply voltage is less than the first supply voltage.

In yet another embodiment, a method of operating a capacitive sensor system includes controlling a first switch to couple a first supply voltage to a first capacitor during a first mode and to couple the first capacitor to an analog to digital converter (ADC) during a second mode; controlling a second switch to couple a second capacitor to a second supply voltage during the first mode and to the ADC during the second mode, wherein a resistive element includes a first terminal coupled between the first capacitor and the first switch, and a second terminal coupled between the second capacitor and the second switch, a microcontroller including the ADC further includes a first communication port coupled to an output of the first switch and a second communication port coupled to an output of the second switch, and the first and second capacitors are external to the ADC.

What is claimed is:

1. A capacitive sensor system, comprising:
   an analog to digital converter (ADC);
   a capacitive sensor device including:
      a sense electrode including a first capacitor;
      a first supply voltage;
      a first switch operable to couple the sense electrode to the first supply voltage during a first mode and the ADC during a second mode;
      a second capacitor;
      a second supply voltage different than the first supply voltage;
      a second switch operable to couple the second capacitor to the second supply voltage during the first mode and to an open circuit during the second mode;
      a resistive element including a first terminal coupled between the first capacitor and the first switch, and a second terminal coupled between the second capacitor and the second switch.

2. The capacitive sensor system of claim 1, wherein the first supply voltage is less than the second supply voltage and the second supply voltage is greater than zero.

3. The capacitive sensor system of claim 1, wherein first supply voltage is greater than zero and the second supply voltage is less than the first supply voltage.

4. The capacitive sensor system of claim 1, wherein capacitance of the first capacitor is approximately equal to capacitance of the second capacitor.

5. The capacitive sensor device of claim 1, wherein resistance of the resistive element is between 1 and 10 kilo Ohms.

6. The capacitive sensor system of claim 1, wherein capacitance of the first and second capacitors is between 5 and 20 picofarads.

7. The capacitive sensor system of claim 1, further comprising:
   a microcontroller including input/output ports coupled to the first and second capacitors;
   control circuitry in the microcontroller configured to
      control the first and second switches in the first mode to allow the first capacitor to discharge while the second capacitor charges; and
      control the first and second switches in the second mode once the first capacitor is discharged and the second capacitor is charged.

8. The capacitive sensor system of claim 1, further comprising:
   a microcontroller including input/output ports coupled to the first and second capacitors;
   control circuitry in the microcontroller configured to
      control the first and second switches in the first mode to allow the first capacitor to charge while the second capacitor discharges; and
      control the first and second switches in the second mode once the first capacitor is charged and the second capacitor is discharged.

9. The capacitive sensor system of claim 1, wherein the capacitive sensor device is a capacitive touch sensor.

10. The capacitive sensor system of claim 1, wherein the resistive element is one of a group consisting of a resistor and a switch.

11. The capacitive sensor device of claim 10, wherein when the resistive element is the switch, the switch is open during the first mode and closed during the second mode.

12. The capacitive sensor device of claim 1, further comprising:
   a microprocessor, wherein the first and second capacitors are external to the microprocessor and the first and second switches are internal to the microprocessor.

13. A capacitive sensor system comprising:
   an analog to digital converter (ADC);
   a capacitive sensor device including:
      an electrode external to the ADC;
      a first switch including a first terminal coupled to a first terminal of the electrode, and switchable to a first supply voltage during a first mode and to the ADC during a second mode;
      a capacitor external to the ADC;
      a second switch including a first terminal coupled to a first terminal of the capacitor, and switchable to a second supply voltage during the first mode and to an open circuit condition during the second mode.

14. The capacitive sensor system of claim 13, further comprising:
   a resistive element including a first terminal coupled between the electrode and the first switch, and a second terminal coupled between the capacitor and the second switch.

15. The capacitive sensor system of claim 13, further comprising:
   a third switch including a first terminal coupled between the electrode and the first switch, and a second terminal coupled between the capacitor and the second switch, wherein the third switch is open during the first mode and closed during the second mode.

16. The capacitive sensor system of claim 13, further comprising:
   a microcontroller including the ADC and a first communication port coupled to a second terminal of the first switch and a second communication port coupled to a second terminal of the second switch.

17. The capacitive sensor system of claim 13, further comprising:
   control circuitry in the microcontroller configured to perform at least one of a group consisting of:
      control the first and second switches in the first mode to allow a first capacitor in the electrode to discharge while the second capacitor charges, and control the first and second switches in the second mode once the first capacitor is discharged and the second capacitor is charged; and
      control the first and second switches in the first mode to allow the first capacitor to charge while the second capacitor discharges, and control the first and second switches in the second mode once the first capacitor is charged and the second capacitor is discharged.

18. The capacitive sensor system of claim 13, wherein the first supply voltage is less than the second supply voltage and the second supply voltage is greater than zero.

19. The capacitive sensor system of claim 13, wherein the first supply voltage is greater than zero and the second supply voltage is less than the first supply voltage.

20. A method of operating a capacitive sensor system, comprising:
- controlling a first switch to couple a first supply voltage to a first capacitor during a first mode and to couple the first capacitor to an analog to digital converter (ADC) during a second mode;
- controlling a second switch to couple a second capacitor to a second supply voltage during the first mode and to the ADC during the second mode, wherein
- a resistive element includes a first terminal coupled between the first capacitor and the first switch, and a second terminal coupled between the second capacitor and the second switch,
- a microcontroller including the ADC further includes a first communication port coupled to an output of the first switch and a second communication port coupled to an output of the second switch, and
- the first and second capacitors are external to the ADC.

\* \* \* \* \*